United States Patent [19]

Koshikawa et al.

[11] Patent Number: 5,539,693
[45] Date of Patent: Jul. 23, 1996

[54] METHOD OF CONTROLLING SEMICONDUCTOR STORAGE CIRCUIT

[75] Inventors: Yasuji Koshikawa; Yasuhiro Takai, both of Tokyo, Japan

[73] Assignee: NEC Corporation, Tokyo, Japan

[21] Appl. No.: 362,157

[22] Filed: Dec. 22, 1994

[30]  Foreign Application Priority Data

Dec. 24, 1993 [JP] Japan .................................. 5-327063

[51] Int. Cl.⁶ ............................................. G11C 11/40
[52] U.S. Cl. .......................... 365/189.05; 365/189.04; 365/233
[58] Field of Search ........................... 365/233, 189.05, 365/230.08, 189.04

[56]  References Cited

U.S. PATENT DOCUMENTS

5,341,341  8/1994  Fukuzo ............................... 365/189.05
5,426,606  6/1995  Takai .................................. 365/189.05

*Primary Examiner*—A. Zarabian
*Attorney, Agent, or Firm*—Sughrue, Mion, Zinn, Macpeak & Seas

[57]  ABSTRACT

In the semiconductor integrated circuit of the present invention, write and read operation are successively implemented in which a manner that read addresses are inputted after write addresses are inputted and read data is read from a sense amplifier starting from the next cycle after all the data have been written to the sense amplifier.

9 Claims, 6 Drawing Sheets

METHOD OF CONTROLLING SEMICONDUCTOR STORAGE CIRCUIT

BACKGROUND OF THE INVENTION

1. Field of the Invention

The present invention relates to a method of controlling a semiconductor storage circuit, more particularly to a method of controlling a continuous write and read operation to be implemented in a pipeline circuit.

2. Description of the Prior Art

Recently, with the advance of the operation speed of a CPU, there has been an increasing demand for a semiconductor storage device which operates at high speed.

However, because of a physical limit against the minute fractionization of the device manufacturing process or an increased chip size due to desired enlargement of the capacity, it can not be said that the demand for the high speed semiconductor storage device has been sufficiently satisfied.

Therefore, as a means for solving the above problem, there is proposed DRAM which has an internal pipeline structure.

Figure 1:
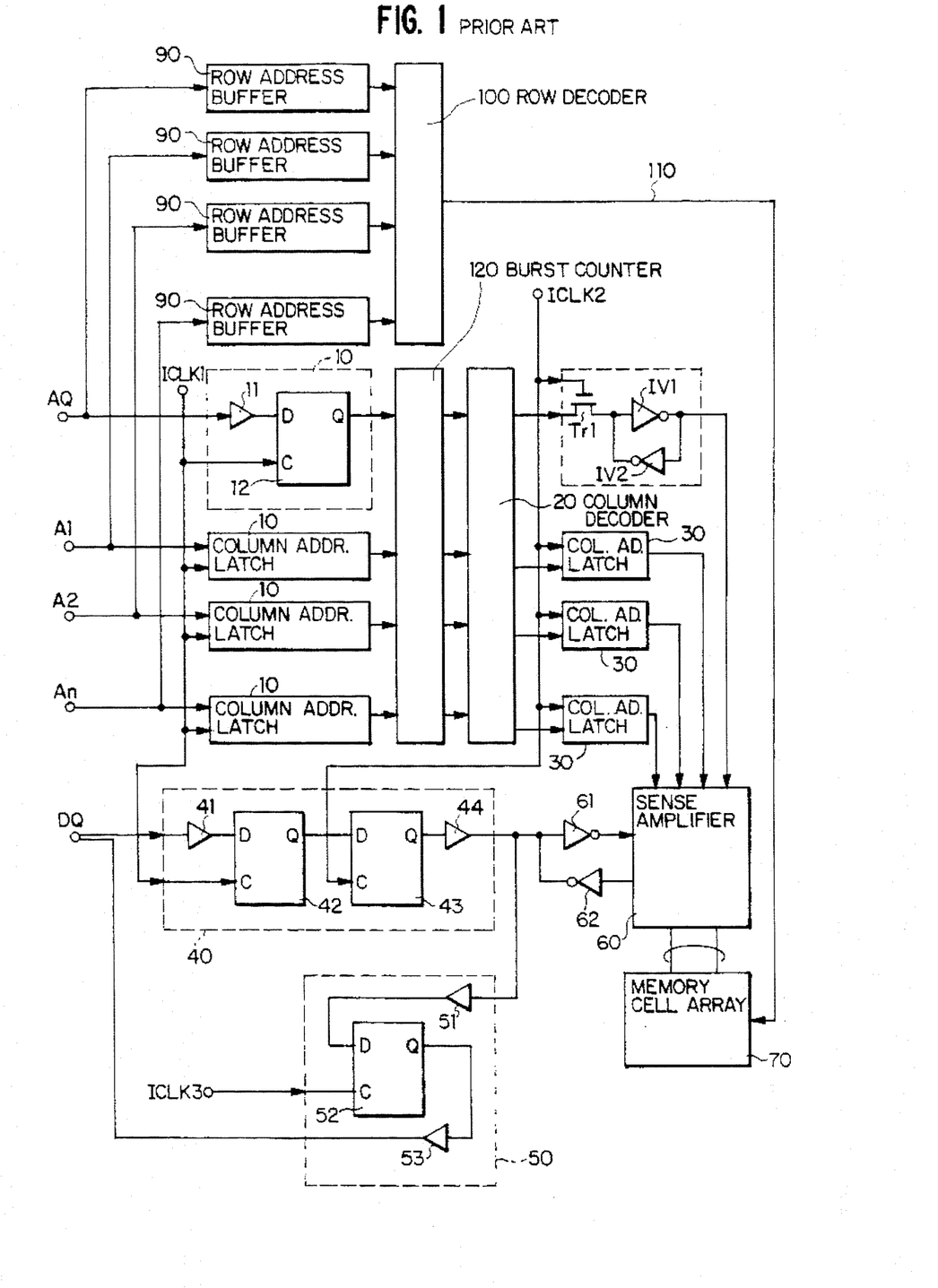
FIG. 1 is a circuit diagram of a conventional DRAM in a block form.

FIG. 1 is a circuit diagram in a block form showing a conventional DRAM which has a pipeline structure. In the block diagram, a data-in latch 40 comprises a write buffer 41 which receives write data from a terminal DO, a D-F/F circuit 42 for latching an output of the write buffer 41 with the timing of an internal clock signal ICLK1, a D-F/F circuit 43 for latching an output of the D-F/F circuit 42 with the timing of an internal clock signal ICLK2, and a write amplifier 44 for receiving an output of the D-F/F circuit 43 and outputting it to a R/W bus 80. A buffer 61 outputs data on the R/W bus 80 to a sense amplifier 60, and a buffer 62 receives an output of the sense amplifier 60 to output it to the R/W bus 80. A plurality of pairs of bit lines between the sense amplifier 60 and a memory cell array 70 constitutes a write/read path. The memory cell array 70 includes a plurality of memory cells disposed in the directions of rows and columns in a form of array. A data-out latch 50 comprises a buffer 51 which receives data on the R/W bus 80, a D-F/F circuit 52 for latching an output of the buffer 51 with the timing of an internal clock signal ICLK3, and a data-out buffer 53 for receiving an output of the D-F/F circuit 52 and transmitting the received output to the terminal DO as read data. A column address latch 10 comprises column address buffers 11 which receive address signals A0, A1, A2, ---, An from the outside, respectively, and a D-F/F circuit 12 for latching an output of the column address buffer 11 with the timing of the internal clock signal ICLK1. A burst counter 120 generates column addresses based on column addresses latched in the D-F/F circuit 12. The number of column addresses to be generated equals to the burst length. A column decoder 20 is supplied with outputs of the burst counter 12. A column address latch 30 comprises inverter IV1 and IV2 and an N channel type transistor Tr1 which receives the internal clock signal ICLK2 on its gate, and receives an output from the column decoder 20 to output a column switch signal. Row address buffers 90 receive address signals A0, A1, A2, . . . , An from the outside, respectively. A row decoder 100 receives and decodes the outputs of row address buffers 90 and drives word lines 110 connected with the memory cell 70.

Write operation of DRAM shown in FIG. 1 will next be described also with reference to FIG. 2.

Figure 2:
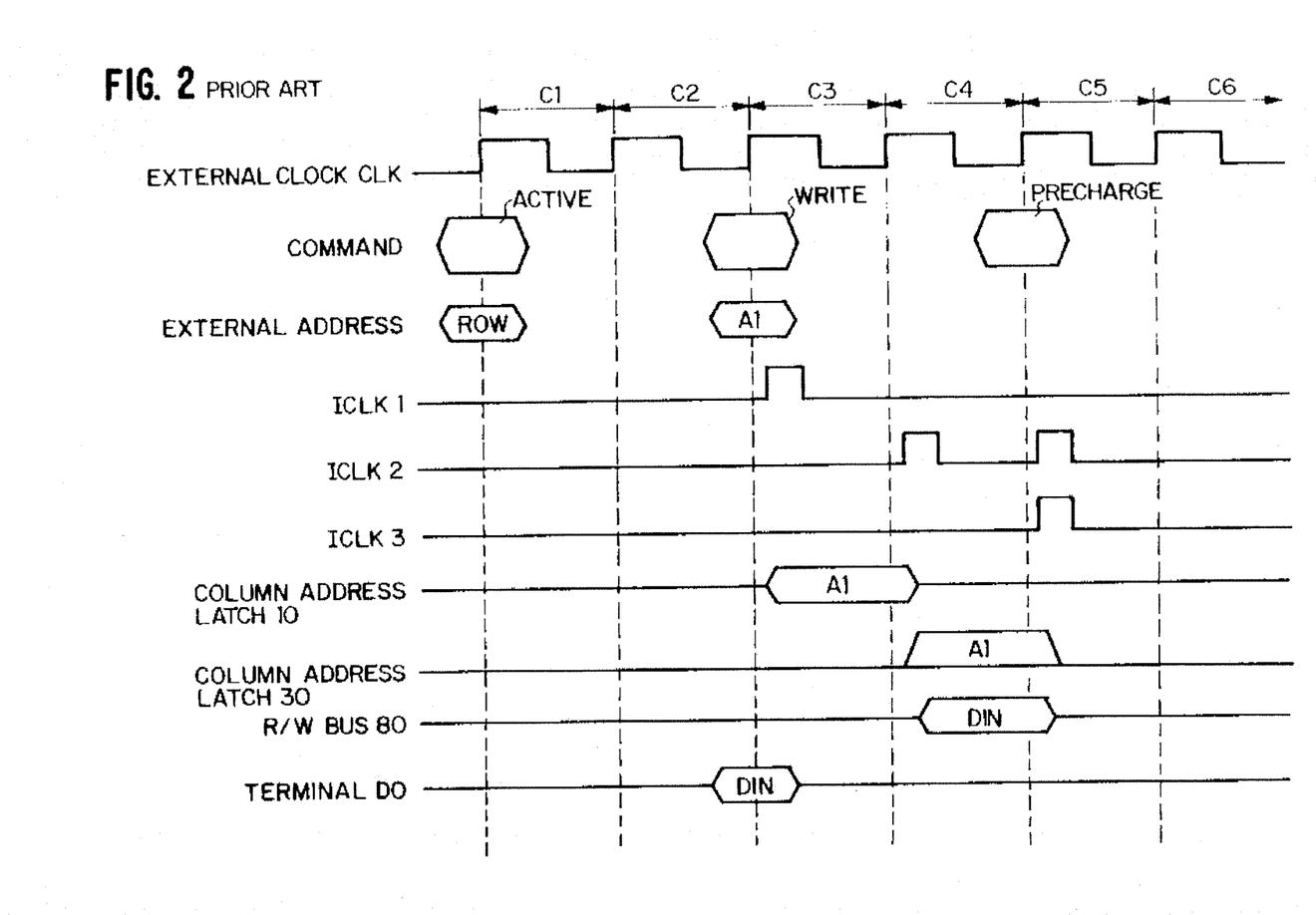
FIG. 2 is a timing chart showing the write operation of DRAM shown in FIG. 1.

In FIG. 2, when, in a cycle C1, a combination of data supplied to input terminals is selected as an active command at the leading edge of the external clock signal CLK from the outside, then the data on address terminals at that time are latched in the row address buffers 90 as row addresses and are decoded to select a word line.

Next, in a cycle C3, when a combination of data supplied to input terminals is Selected as a write command, the data A1 on the address terminal at that time is latched in the D-F/F12 with the timing of the internal clock signal ICLK1 as a column address. When the write command is inputted, the internal clock signals ICLK1, ICLK2, and ICLK3 are generated by an internal clock generation circuit which is not shown. The internal clock signal ICLK1 becomes a high level only one time in the cycle C3 in which the write command is inputted. The internal clock signal ICLK2 becomes a high level in a cycle C4 and C5 delayed from the write command by one cycle and two cycles, respectively. The internal clock signal ICLK3 becomes a high level only one time in the cycle C5 delayed from the write command by two cycles. When the internal clock signal ICLK1 becomes a high level state only one time in the cycle C3, the address data A1 is transmitted to the column decoder 20 to be latched therein.

Next, when the internal clock signal ICLK2 becomes a high level only one time in the cycle C4, the address data A1 is transmitted to the column address latch 30 and latched therein during the time period of the high level state. On the other hand, data DIN inputted from the terminal DO as write data in the cycle C3 is transmitted by the internal clock signals ICLK1 and ICLK2 of the high level state and is written to the sense amplifier 60 through the R/W bus 80 in the cycle C4. Thereafter, the data DIN is written in the memory cell from the sense amplifier 60 in a cycle C5.

The internal clock signal ICLK2 resets the address data latched in the column address latch 30 in the cycle C5. Also a precharge command for resetting a row address can first be inputted in the cycle C5 in which data is written into the memory cell.

Read operation of DRAM shown in FIG. 1 will next be described with reference to FIG. 3.

When a read command is inputted in a cycle C3, data A2 on the address terminal at this time is latched in the column address buffer 10 as a column address in the same manner as in the write time, and internal clock signals ICLK1, ICLK2, ICLK3 are generated in the same way as in the write operation. When the internal clock signal ICLK1 becomes a high level only one time in the cycle C3, the address data A2 is transmitted to the column decoder 20 and latched therein.

Subsequently, when the internal clock signal ICLK2 becomes a high level in a cycle C4, the column address latch 30 is selected to transmit the address data A2 to the column address latch 30 during this cycle and then the address data A2 is latched in the column address latch 30. When the column address latch is selected, the data in the sense amplifier 60 is transmitted through the R/W bus 80 and latched by the data-out latch 50 in the cycle C4.

Following which, when the internal clock signal ICLK3 becomes a high level in the cycle C5, the data latched in the data-out latch 50 is outputted to the terminal DO.

In the read operation, the data stored in the sense amplifier 60 is read in the cycle C4, and hence it becomes possible to input a precharge command in the cycle C4.

Figure 3:
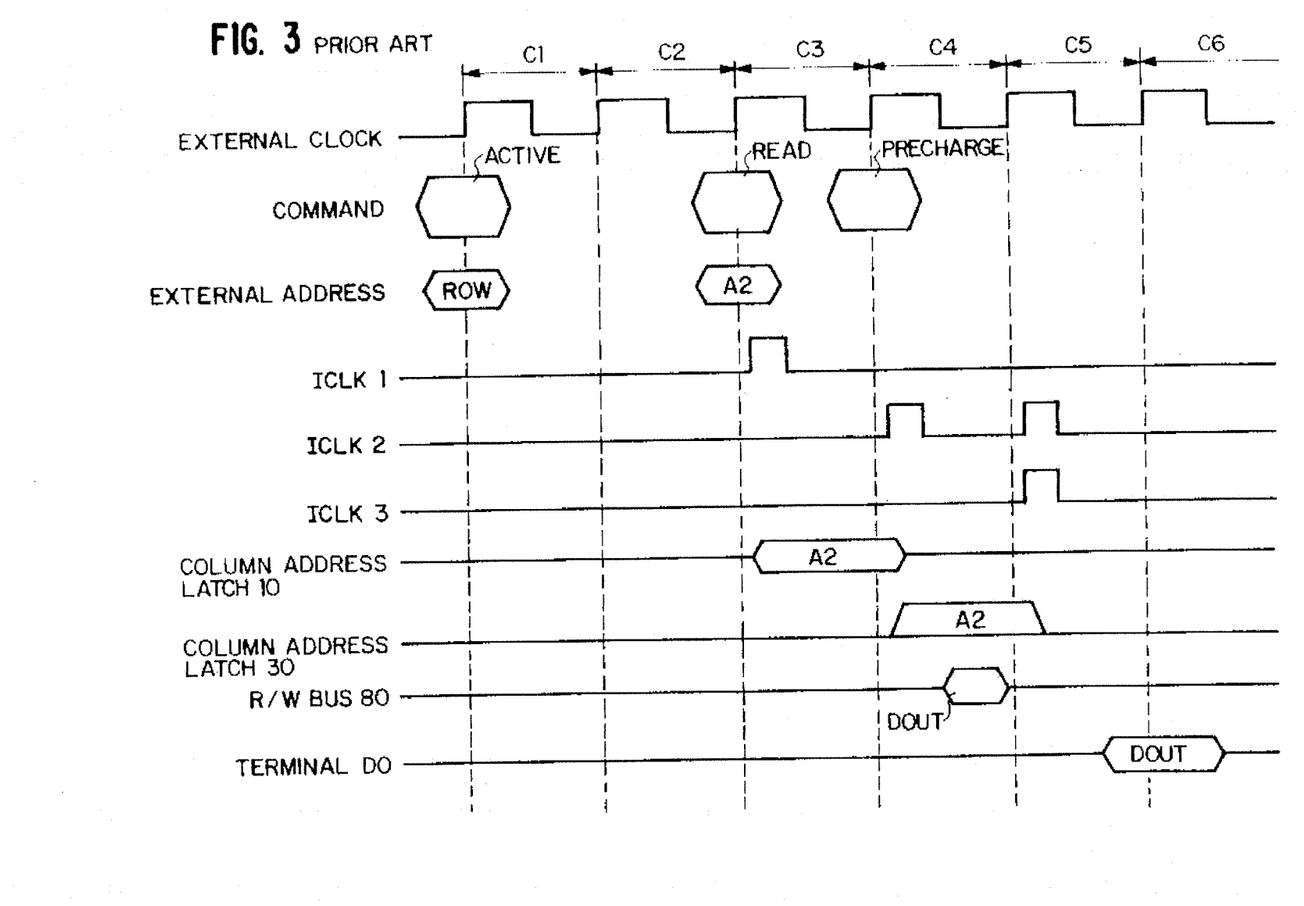
FIG. 3 is a timing chart showing the read operation of DRAM shown in FIG. 1.

The operations shown in FIG. 2 and FIG. 3 are operations with the burst length being equal to 1, and in which only one address is accessed for one write command or one read command and also the data is inputted or outputted only once for the command. The burst length is determined by the mode register set operation before the active command is inputted.

Figure 4:
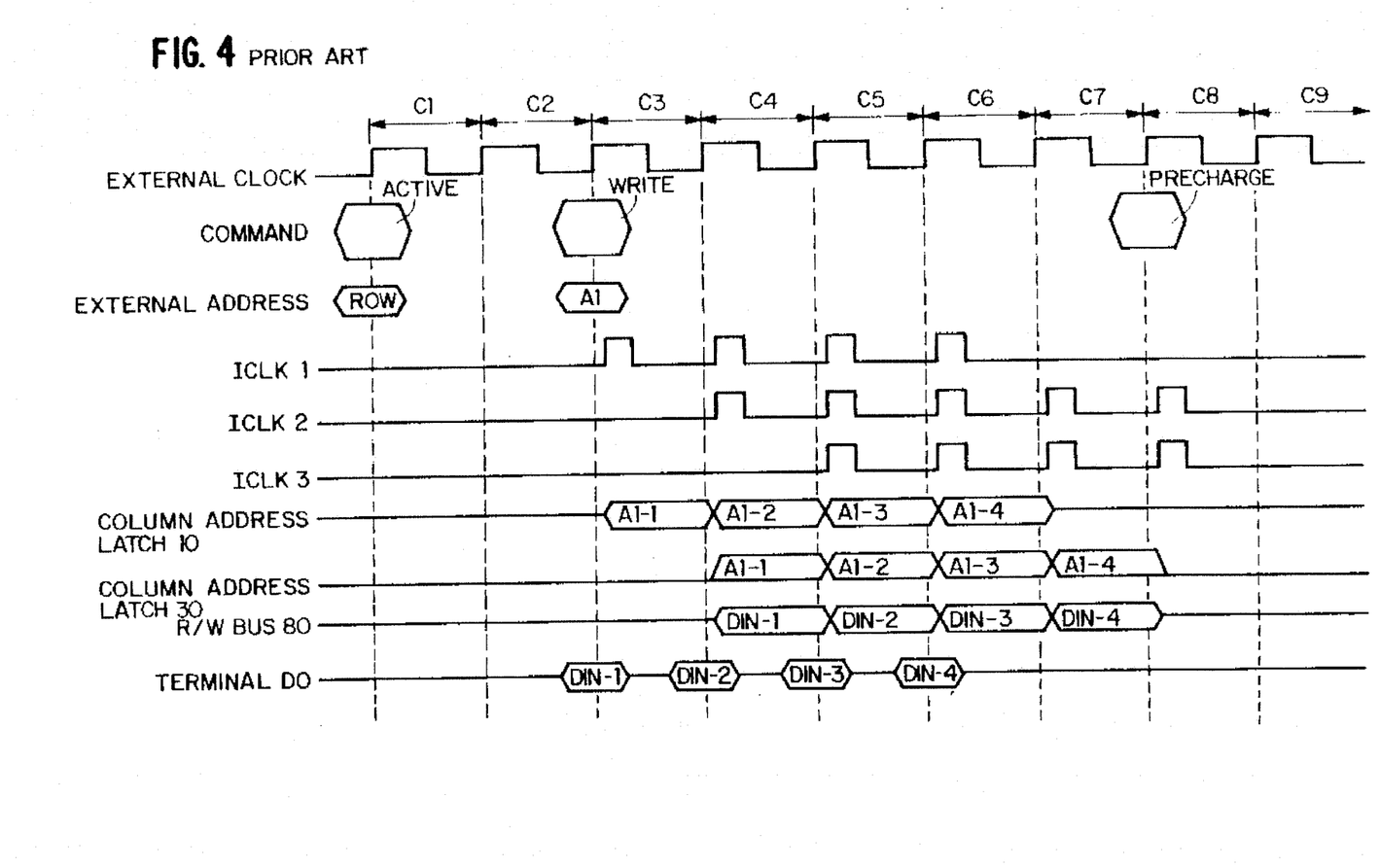
FIG. 4 is a timing chart showing the write operation of DRAM shown in FIG. 1.

FIG. 4 shows the write operation in the case of burst length being equal to 4. When a write command is inputted in the cycle C3 and address data A1-1 is inputted, then address data A1-2, A1-3, A1-4 are produced in the cycles C4, C5, C6, respectively, by means of the internal burst counter 120. At this time, the internal clock signals ICLK1, ICLK2, ICLK3 are energized 4, 5, 6 and times, respectively, and 4-bit data is written thereby. Since 1-bit data is written in one cycle during the burst operation, when the burst length is 4, writing of 4-bit data is completed in six cycles which starts from the cycle for inputting the write command.

With this conventional method of controlling the semiconductor storage circuit, three clock cycles are required from the input of the write command to data writing in a memory cell and three clock cycles are also required from the input of the read command to data reading from the memory cell. Therefore, if write, and read operations are each operated for 1 bit on the same word line, at least six clock cycles are needed, yielding poor efficiency of a pipeline circuit.

SUMMARY OF THE INVENTION

It is an object of the present invention is to provide a method of controlling a semiconductor storage circuit, which is capable of effectively utilizing a circuit of a pipeline structure in the semiconductor storage circuit.

In order to achieve the above object, according to the present invention, there is provided a method of controlling a semiconductor storage circuit which comprises: a memory cell array including a plurality of memory cells disposed in the directions of rows and columns in a form of array, a plurality of pairs of bit lines connected with these memory cells, a plurality of word lines connected with these memory cells; a sense amplifier connected to the ends of each pair of bit lines for amplifying an electric potential difference between two lines of the pair of bit lines in response to an activation signal; row address buffers and column address buffers which receive address signals; a row decoder for decoding output signals of the row address buffers and driving the word line connected with the memory cells; a column decoder for decoding output signals of the column address buffers and driving a pair of bit lines connected with the memory cells; a data amplifier for receiving an output signal of the sense amplifier selected by the column decoder and amplifying the received signal at the time when data is read from the memory cell array; a data-out buffer for receiving an output signal of the data amplifier and outputting the received signal to an input/output terminal; a write buffer for receiving a write data signal supplied from the input/output terminal at the time when the data is written in the memory cell array; a write amplifier for receiving an output signal of the write buffer and outputting write data to the memory cell selected by the row and column decoders, respectively; and latch circuit disposed immediately before or immediately after the column address buffers, the column decoders, the data-out buffer, the write buffer and the write amplifier, respectively and controlled by an external clock signal; the method comprising the steps of:

inputting an active command to determine a row address;

inputting a write command;

latching the column address determined through the input of said write command in said latch circuit disposed immediately before or immediately after said column address buffer, and latching a write data inputted from said input/output terminal in said latch circuit disposed immediately before or immediately after said write buffer, in response to a first internal clock signal synchronized with the external clock signal in the cycle when said write command was inputted;

latching the output signal of said column address buffer in said latch circuit disposed immediately before or immediately after said column decoder and latching the output of said write buffer in said latch circuit disposed immediately before or immediately after said write amplifier, in response to a second internal clock signal synchronized with the external clock signal in the cycle next to the cycle when said write command was inputted;

inputting a read command in the cycle next to the cycle when said write command was inputted;

latching the column address determined through the input of said read command in said latch circuit disposed immediately before or immediately after said column address buffer, in response to the first internal clock signal synchronized with the external clock signal in the cycle when said read command was inputted;

latching the output signal of said column address buffer in said latch circuit disposed immediately before or immediately after said column decoder, in response to the second internal clock signal synchronized with the external clock signal in the cycle next to the cycle when said read command was inputted; and latching the output signal of said data amplifier in said latch circuit disposed immediately before or immediately after said data-out buffer, in response to a third internal clock signal synchronized with the external clock signal in the cycle next to the cycle when said read command was inputted.

In the semiconductor storage circuit further comprising a burst counter for generating a column address/column addresses depending on the column address inputted from the outside, synchronized with the external clock, it is practical, after the row address is determined by an active command and the word line is selected, to input a write command and further input a read command with the timing of the external clock in a cycle which follows immediately after the cycle in which all column addresses necessary for write have been generated by the burst counter.

Further, the semiconductor storage circuit comprising a read/write bus composed of at least a part of the wiring provided between the latch circuit disposed immediately before or immediately after the write amplifier and the sense amplifier and at least a part of the wiring provided between the latch circuit disposed immediately before or immediately after the data-out buffer and the sense amplifier, the semiconductor storage circuit may further be structured such that the read data is transmitted through the read/write bus in the cycle synchronized with the external input clock which follows immediately after the cycle in which the write data has been transmitted through the read/write bus.

In the present invention, a semiconductor storage circuit is controlled such that write address are inputted before read addresses have been inputted, and read data can be read from a sense amplifier starting from the cycle which follows immediately after the cycle in which all of the write data has been inputted in the sense amplifier. Therefore, the number of cycles to be required for performing write and read operation on the same word line can be decreased, thereby enabling to effectively use a circuit of a pipeline structure.

DESCRIPTION OF THE PREFERRED EMBODIMENTS

Figure 5:
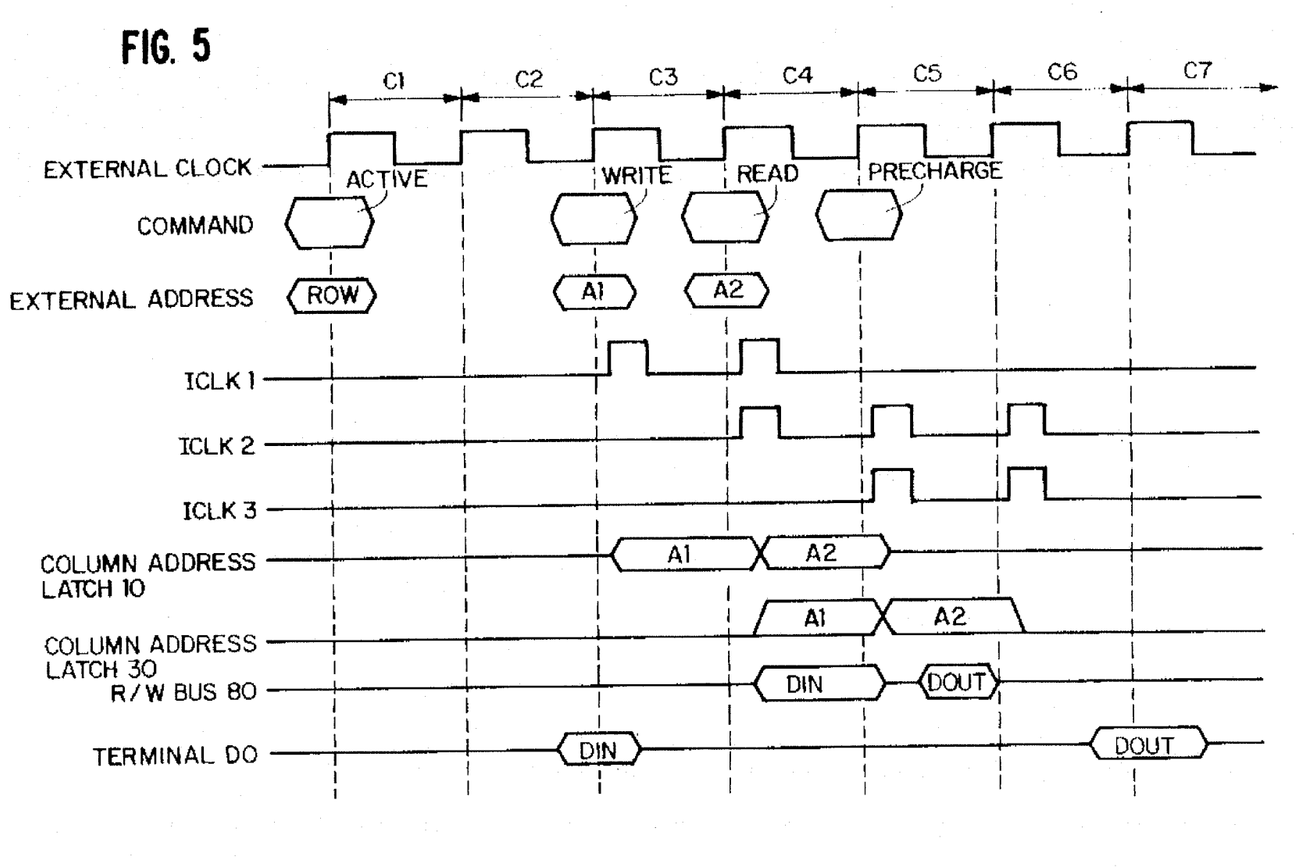
FIG. 5 is a timing chart showing a first embodiment of the present invention.

A first embodiment of the present invention, in which the burst length is set to 1 will be explained hereinafter with reference to FIGS. 1 and 5.

When an active command is inputted in a cycle C1, address data in the cycle C1 is latched in the row address buffer 90 as a row address and a word line is selected corresponding thereto by the row decoder.

Next, when a write command is inputted in a cycle C3, address data A1 is latched in the column address buffer 11 as a column address. When an internal clock signal ICLK1 becomes a high level in the cycle C3, the address data A1 is transmitted to the D-F/F12 and latched therein.

Subsequently, when an internal clock signal ICLK2 becomes a high level in a cycle C4, the column address latch 30 is selected. Therefore, the address data A1 is transmitted to the column address latch 30 to be latched therein during a time period of this high level state of the internal clock signal ICLK2. At the same time, when a read command is inputted in the cycle C4, an address data A2 is latched in the D-F/F12.

When the internal clock signal ICLK2 becomes a high level in a cycle C5, the address data A2 is transmitted to the column address latch 30 to be latched therein.

On the other hand, when the internal clock signal ICLK2 becomes a high level in a cycle C4, data DIN inputted from the terminal DO as write data in the cycle C3 is latched in the D-F/F43 and is supplied to the sense amplifier 60 through the write amplifier 44, the R/W bus 80 and the buffer 61 in the cycle C4 to be written into a memory cell in the cycle C5.

When the internal clock signal ICLK3 becomes a high level in a cycle C5, output data DOUT outputted in response to the read command which is inputted in the cycle C4 is transmitted from the sense amplifier 60 through the R/W bus 80 to the data-out latch 50 to be latched therein in the cycle C5 and then outputted to the terminal DO in a cycle C6.

Since the operation of the sense amplifier 60 is finished in the cycle C5, a precharge command can be inputted in this cycle C5 successively.

Figure 6:
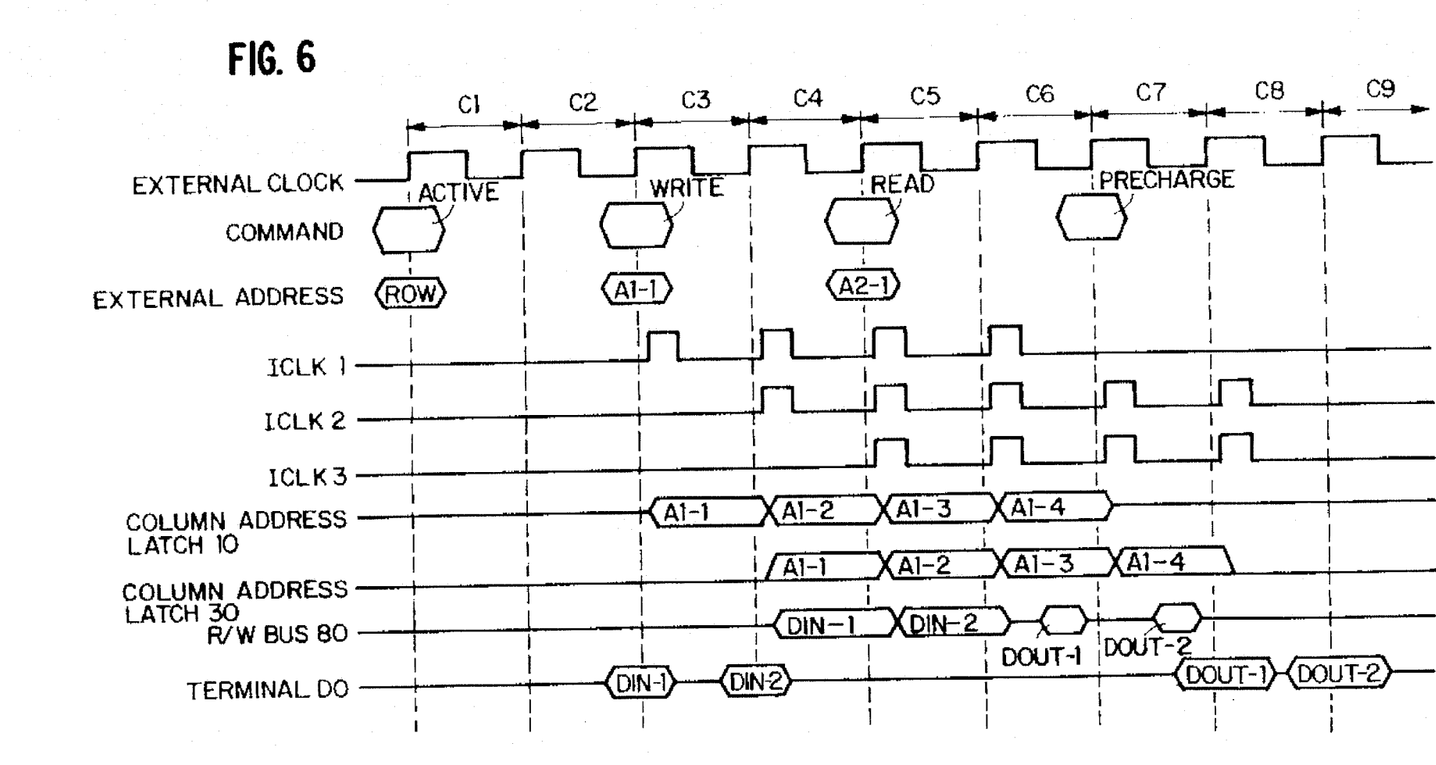
FIG. 6 is a timing chart showing a second embodiment of the present invention.

A second embodiment of the present invention, in which the burst length is set to 2, will be explained hereinafter with reference to FIGS. 1 and 6.

An active command is inputted in a cycle C1 in the same way as in the burst length being equal to 1. When a write command is inputted in a cycle C3 and the first internal clock signal ICLK1 becomes a high level, an address data A1-1 is latched in the column address latch 10 as a column address. In a next cycle C4, when the internal clock signal ICLK1 becomes a high level, an address data A1-2 generated by the burst counter 120 is latched in the column decoder 20. In cycles C4 and C5, when the second internal clock signal ICLK2 becomes a high level, column address latches 30 of the address data A1-1, A1-2 are selected to latch the address data therein, respectively.

When a read command is inputted in the cycle C5 and the first internal clock signal ICLK1 becomes a high level, an address data A2-1 is latched in the column address latch 10 as a column address in the same way as above. When the second internal clock signal ICLK2 becomes a high level in a cycle 6, then address data A2-2 is generated by the burst counter 120 and latched in the column decoder 20 as a column address. When the second internal clock signal ICLK2 becomes a high level in cycles C6, C7, column address latches 30 of the address data A2-1, A2-2 are selected and the address data are latched in the selected column address latch.

When the first internal clock signal ICLK1 becomes a high level, write data DIN-1 and DIN-2 are inputted in the cycles C3 and C4, respectively. When the second internal clock signal ICLK2 becomes a high level, then data DIN-1 and DIN-2 are latched in the D-F/F43 and inputted into the sense amplifier 60 through the write amplifier 44, the R/W bus 80 and the buffer 1 in cycles C4 and C5, respectively, and further written in the memory cell in the cycles C5 and C6, respectively.

When the third internal clock signal ILK3 becomes high a high level in the cycle C6 and C7, the data DOUT-1 and DOUT-2 which are read from the memory cell array 70 are transmitted from the sense amplifier 60 through the buffer 62, the R/W bus 80 to the data-out latch 50 to be latched therein in a cycle C6 and C7, respectively, and further outputted to the terminal DO in cycles C7 and C8, respectively.

A precharge command can be inputted in the cycle C7 when reading of the data from the sense amplifier 60 is finished in the cycle C7.

While a preferred embodiment of the invention has been described using specific terms, such description is for illustrative purposes only, and it is to be understood that changes and variations may be made without departing from the spirit or scope of the following claims.

What is claimed is:

1. A method of controlling a semiconductor storage circuit which includes: a memory cell array which includes a plurality of memory cells arranged in rows and columns, a plurality of pairs of bit lines connected with said plurality of memory cells, and a plurality of word lines connected with said plurality of memory cells; a sense amplifier which is connected to first ends of each of said pairs of bit lines, wherein said sense amplifier amplifies an electric potential difference between two lines of said pairs of bit lines in response to an activation signal; row address buffers and column address buffers which receive address signals; a row decoder for decoding said address signals output from said row address buffers and driving at least one of said word lines connected with said memory cells; a column decoder for decoding said address signals output from said column address buffers and driving at least one of said pairs of bit lines connected with said memory cells; a data amplifier for receiving an output data signal from said sense amplifier selected by said column decoder and amplifying said output data signal as an amplified output data signal when data is read from said memory cell array; a data-out buffer for receiving said amplified output data signal output from said data amplifier and outputting the said amplified output data signal to an input/output terminal; a write buffer for receiving a write data signal supplied from said input/output terminal when data is written into said memory cell array; a write amplifier for receiving said write data signal from said write buffer and outputting an amplified write data signal to said memory cell selected by said row and column decoders; a column address buffer latch circuit disposed immediately before or immediately after said column address buffers; a column decoder latch circuit disposed immediately before or immediately after said column decoder; a data-out buffer latch circuit disposed immediately before or immediately after said data-out buffer; a write buffer latch circuit disposed immediately before or immediately after said write buffer; and a write amplifier latch circuit disposed immediately before or immediately after said write amplifier, said method comprising the steps of:

inputting an active command to determine a row address;

inputting a write command in a first cycle;

latching a first column address, input in correspondence with said write command, in said column address buffer latch circuit, wherein said first column address is latched during said first cycle in accordance with a first internal clock signal synchronized with an external clock signal;

latching a first write data signal input from said input/output terminal in said write buffer latch circuit during said first cycle, wherein said first write data signal is latched in response to said first internal clock signal;

latching the first column address output from said column address buffer latch circuit in said column decoder latch circuit in response to a second internal clock signal synchronized with the external clock signal in a second cycle, wherein said second cycle is next to said first cycle during which said write command was input;

latching the first write data signal output from said write buffer latch circuit in said write amplifier latch circuit in response to said second internal clock signal in the second cycle;

inputting a read command in the second cycle;

latching a second column address, input in correspondence with said read command, in said column address buffer latch circuit, wherein said second column address is latched in response to the first internal clock signal during the second cycle when said read command was input;

latching the second column address output from said column address buffer latch circuit in said column decoder latch circuit in response to the second internal clock signal during a third cycle, wherein said third cycle is next to the second cycle; and latching the amplified output data signal of said data amplifier in said data-out buffer latch circuit in response to a third internal clock signal synchronized with the external clock signal during the third cycle.

2. A method of controlling a semiconductor storage circuit which including: a memory cell array which includes a plurality of memory cells arranged in rows and columns, a plurality of pairs of bit lines connected with said plurality of memory cells, and a plurality of word lines connected with said plurality of memory cells; a sense amplifier which is connected to first ends of each of said pairs of bit lines, wherein said sense amplifier amplifies an electric potential difference between two lines of said pairs of bit lines in response to an activation signal; row address buffers and column address buffers which receive external address signals; a row decoder for decoding said external address signals output from said row address buffers and driving at least one of said word lines connected with said memory cells; a column decoder for decoding said external address signals output from said column address buffers and driving at least one of said pairs of bit lines connected with said memory cells; a data amplifier for receiving output data signals from said sense amplifier selected by said column decoder and amplifying said output data signals as amplified output data signals when data is read from said memory cell array; a data-out buffer for receiving said amplified output data signals output from said data amplifier and outputting the amplified output data signals to an input/output terminal; a write buffer for receiving write data signals supplied from said input/output terminal when data is written into said memory cell array; a write amplifier for receiving said write data signals from said write buffer and outputting amplified write data signals to said memory cell selected by said row and column decoders; a column address buffer latch circuit disposed immediately before or immediately after said column address buffers; a column decoder latch circuit disposed immediately before or immediately after said column decoder; a data-out buffer latch circuit disposed immediately before or immediately after said data-out buffer; a write buffer latch circuit disposed immediately before or immediately after said write buffer; a write amplifier latch circuit disposed immediately before or immediately after said write amplifier; and a burst counter for generating additional column addresses based on said external address signals, wherein said burst counter generates said additional column addresses in synchronicity with an external clock signal, said method comprising the steps of:

inputting an active command to determine a row address;

inputting a write command in a first cycle;

latching successively a first column address, input in correspondence with said write command, and at least one additional first column address generated by said burst counter in said column address buffer latch circuit, immediately before or immediately after said column address wherein said first column address and said at least one additional first column address are successively latched beginning with said first cycle and in accordance with a first internal clock signal synchronized with said external clock signal;

latching successively first write data signals input from said input/output terminal in said write buffer latch circuit, wherein said first write data signals are successively latched beginning with said first cycle and in response to said first internal clock signal;

latching successively the first column address and said at least one additional first column address output from said column address buffer latch circuit in said column decoder latch circuit in response to a second internal clock signal synchronized with the external clock signal, wherein said first column address and said at least one additional first column address are successively latched beginning with a second cycle and wherein said second cycle is next to said first cycle;

latching successively the first write data signals output from said write buffer latch circuit in said write amplifier latch circuit in response to said second internal clock signal, wherein said first write data signals are successively latched beginning with said second cycle;

inputting a read command in a write complete cycle, wherein said write complete cycle is a cycle after said first column address and said at least one additional first column address have been successively latched in said column address buffer latch circuit;

latching successively a second column address, input in correspondence with said read command, and at least one additional second column address generated by said burst counter in said column address buffer latch circuit, wherein said second column address and said at least one additional second column address are successively latched beginning with said write complete cycle and in accordance with the first internal clock signal;

latching successively the second column address and said at least one additional second column address output from said column address buffer latch circuit in said column decoder latch circuit in response to the second internal clock signal, wherein said second column address and said at least one additional second column address are successively latched beginning with a third cycle and wherein said third cycle is next to the write complete cycle during which said read command was input; and latching successively the amplified output data signals of said data amplifier in said data-out buffer latch circuit in response to a third internal clock signal synchronized with the external clock signal, wherein said amplified output data signals are successively latched beginning with the third cycle.

3. The method of controlling a semiconductor storage circuit according to claim 1, further comprising the step of:

providing a read/write bus, wherein said read/write bus constitutes at least a part of a connection between said write amplifier latch circuit and said sense amplifier, wherein said read/write bus constitutes at least a part of a connection between said data-out buffer latch circuit and said sense amplifier, and wherein said output data signal is transmitted through said read/write bus in a cycle which follows immediately after a cycle in which the first write data signal is transmitted through said read/write bus.

4. The method of controlling a semiconductor storage circuit according to claim 2, further comprising the step of:

providing a read/write bus, wherein said read/write bus constitutes at least a part of a connection between said write amplifier latch circuit and said sense amplifier, wherein said read/write bus constitutes at least a part of a connection between said data-out buffer latch circuit and said sense amplifier, and wherein said output data signals are transmitted through said read/write bus beginning with a cycle which immediately follows cycles during which the first write data signals are transmitted through said read/write bus.

5. The method of controlling a semiconductor storage circuit according to claim 3, wherein said output data signal is transmitted through said read/write bus in said third cycle and said first write data signal is transmitted through said read/write bus in said second cycle.

6. The method of controlling a semiconductor storage circuit according to claim 4, wherein said output data signals are transmitted through said read/write bus beginning with said third cycle and a last one of said first write data signals are transmitted through said read/write bus in said write complete cycle.

7. The method of controlling a semiconductor storage circuit according to claim 1, wherein said first column address equals said second column address.

8. The method of controlling a semiconductor storage circuit according to claim 2, wherein said first column address equals said second column address.

9. A method of controlling a semiconductor storage circuit which includes: a memory cell array which includes a plurality of memory cells arranged in rows and columns, a plurality of pairs of bit lines connected with said plurality of memory cells, and a plurality of word lines connected with said plurality of memory cells; a sense amplifier which is connected to first ends of each of said pairs of bit lines, wherein said sense amplifier amplifies an electric potential difference between two lines of said pairs of bit lines in response to an activation signal; row address buffers and column address buffers which receive external address signals; a row decoder for decoding said external address signals output from said row address buffers and driving at least one of said word lines connected with said memory cells; a column decoder for decoding said external address signals output from said column address buffers and driving at least one of said pairs of bit lines connected with said memory cells; a data amplifier for receiving output data signals from said sense amplifier selected by said column decoder and amplifying said output data signals as amplified output data signals when data is read from said memory cell array; a data-out buffer for receiving said amplified output data signals output from said data amplifier and outputting the amplified output data signals to an input/output terminal; a write buffer for receiving write data signals supplied from said input/output terminal when data is written into said memory cell array; a write amplifier for receiving said write data signals from said write buffer and outputting amplified write data signals to said memory cell selected by said row and column decoders; a column address buffer latch circuit disposed immediately before or immediately after said column address buffers; a column decoder latch circuit disposed immediately before or immediately after said column decoder; a data-out buffer latch circuit disposed immediately before or immediately after said data-out buffer; a write buffer latch circuit disposed immediately before or immediately after said write buffer; a write amplifier latch circuit disposed immediately before or immediately after said write amplifier; and a burst counter for generating additional column addresses based on said external address signals, wherein said burst counter generates said additional column addresses in synchronicity with an external clock signal, said method comprising the steps of:

inputting an active command to determine a row address;

inputting a write command in a first cycle;

latching a first column address, input in correspondence with said write command, in said column address buffer latch circuit, wherein said first column address is latched during said first cycle in accordance with a first internal clock signal synchronized with said external clock signal;

latching said first column address output from said column address buffer latch circuit in said column decoder latch circuit in response to a second internal clock signal synchronized with the external clock signal, wherein said first column address is latched during a second cycle and wherein said second cycle is next to said first cycle;

generating at least one additional first column address via said burst counter when said first column address is latched in said column address buffer latch circuit;

latching successively said at least one additional first column address in said column address decoder latch circuit in response to said second internal clock, wherein said at least one additional first column address is successively latched beginning with a third cycle, wherein said third cycle is next to said second cycle;

latching successively first write data signals input from said input/output terminal in said write buffer latch circuit in response to said first internal clock signal, wherein said first write data signals are successively latched beginning with said first cycle;

latching successively the first write data signals output from said write buffer latch circuit in said write amplifier latch circuit in response to said second internal clock signal, wherein said first write data signals are successively latched beginning with said second cycle;

inputting a read command in a write complete cycle, wherein said write complete cycle is a cycle in which all of said at least one additional first column address have been successively latched in said column decoder latch circuit;

latching a second column address, input in correspondence with said read command, in said column address buffer latch circuit, wherein said second column address is latched during said write complete cycle in accordance with said first internal clock signal;

latching said second column address output from said column address buffer latch circuit in said column decoder latch circuit in response to said second internal clock signal, wherein said second column address is latched during a fourth cycle and wherein said fourth cycle is next to said write complete cycle;

generating at least one additional second column address via said burst counter when said second column address is latched in said column address buffer latch circuit;

latching successively said at least one additional second column address in said column address decoder latch circuit in response to said second internal clock, wherein said at least one additional second column address is successively latched beginning with a fifth cycle and wherein said fifth cycle is next to said fourth cycle; and latching successively the amplified output data signals of said data amplifier in said data-out buffer latch circuit in response to a third internal clock signal synchronized with the external clock signal, wherein said amplified output data signals are successively latched beginning with the fifth cycle.

* * * * *